United States Patent [19]

Beetz, Jr.

[11] Patent Number: 5,006,914
[45] Date of Patent: Apr. 9, 1991

[54] SINGLE CRYSTAL SEMICONDUCTOR SUBSTRATE ARTICLES AND SEMICONDUCTOR DEVICES COMPRISING SAME

[75] Inventor: Charles P. Beetz, Jr., New Milford, Conn.

[73] Assignee: Advanced Technology Materials, Inc., New Milford, Conn.

[21] Appl. No.: 278,964

[22] Filed: Dec. 2, 1988

[51] Int. Cl.$^5$ .................. H01L 29/161; H01L 29/20; H01L 29/22; H01L 29/24

[52] U.S. Cl. ........................................ 357/61; 357/15; 357/16; 357/20; 357/22; 357/45; 357/49; 357/56; 357/60

[58] Field of Search ............... 357/60, 61, 56, 45, 357/49, 15, 16, 20, 22 I, 22 J, 22 K, 23.2; 437/65, 100, 103, 106; 148/DIG. 148; 252/62.3 C; 423/446

[56] References Cited

U.S. PATENT DOCUMENTS

| | | | |
|---|---|---|---|
| 3,577,285 | 5/1971 | Rutz | 437/103 X |
| 3,636,397 | 1/1972 | Addamiano et al. | 357/61 X |
| 3,982,262 | 9/1976 | Karatsjuba et al. | 437/100 X |
| 4,004,341 | 1/1977 | Tung | 29/571 |
| 4,131,496 | 12/1978 | Weitzel et al. | 357/60 X |
| 4,183,035 | 1/1980 | Wang et al. | 357/61 X |
| 4,596,070 | 6/1986 | Bayraktaroglu | 357/56 X |
| 4,735,920 | 4/1988 | Stephani et al. | 148/DIG. 148 |
| 4,863,529 | 9/1989 | Imai et al. | 437/103 X |
| 4,929,986 | 5/1990 | Yoder | 357/61 X |

OTHER PUBLICATIONS

Jackson, Jr. Don et al, "Fabrication of Epitaxial SiC Films on Silicon," Trans. Met. Soc. AIME, Mar., 1965, pp. 468–472.
"Selective Deposition of Diamond Crystals by Chemical Vapor Deposition Using a Tungsten–Filament Method," Hirabayashi, K. et al., Appl. Phys. Lett., 53 (19), Nov. 1988.
"Ohmic Contacts to Semiconducting Diamond," Moazed, K. L., et al, IEEE Electron Device Letters, vol. 9, No. 7, Jul. 1988.
"Summary Abstract: Device Applications of Diamonds," Geis, M. W. et al, J. Vac. Sci. Technol. A6(3), May/Jun. 1988, pp. 1953–1954.
"High–Temperature Point–Contact Transistors and Schottky Diodes Formed on Synthetic Boron-Doped Diamond", M. W. Geis, D. D. Rathman, D. J. Erlich, IEEE Electron Device Letters, vol. ED1-8, No. 8, Aug. 1987, pp. 341–343.
"Summary Abstract: Epitaxial Growth, Doping, and Analytical Characterization of Monocrystalline Beta-SiC Semiconductor Thin Films," Kim, H. J. et al., J. Vac. Sci Technol., May/Jun. 1988.
"Bipolar Transistor Action in Ion Implanted Diamond," Appl. Phys. Lett., vol. 41, No. 10, Nov. 15, 1982.
"Vapor Growth of Diamond on Diamond and Other Surfaces," Journal of Crystal Growth 52, pp. 219–226 (1981).
"Ion Beam-Assisted Etching of Diamond," Efreow, N. W. et al., J. Vac. Sci. Technol. B3(1), Jan./Feb. 1985, pp. 416–418.

Primary Examiner—Andrew J. James
Assistant Examiner—Sara W. Crane
Attorney, Agent, or Firm—Steven J. Hultquist

[57] ABSTRACT

A textured substrate is disclosed which is amenable to deposition thereon of epitaxial single crystal films of materials such as diamond, cubic boron nitride, boron phosphide, beta-silicon carbide, and gallium nitride. The textured substrate comprises a base having a generally planar main top surface from which upwardly extends a regular array of posts, the base being formed of single crystal material which is crystallographically compatible with epitaxial single crystal materials to be deposited thereon. The single crystal epitaxial layers are formed on top surfaces of the posts which preferably have a quadrilateral cross-section, e.g., a square cross-section whose sides are from about 0.5 to about 20 micrometers in length, to accommodate the formation of substantially defect-free, single crystal epitaxial layers thereon. The single crystal epitaxial layer may be selectively doped to provide for p-type and p+ doped regions thereof, to accommodate fabrication of semiconductor devices such as field effect transistors.

17 Claims, 3 Drawing Sheets

SINGLE CRYSTAL SEMICONDUCTOR SUBSTRATE ARTICLES AND SEMICONDUCTOR DEVICES COMPRISING SAME

BACKGROUND OF THE INVENTION

1. Field of the Invention

This invention relates to substrates on which epitaxial single crystal layers, e.g,. of materials such as diamond, cubic boron nitride, cubic boron phosphide, beta-silicon carbide, gallium nitride, and the like, may be deposited, and also relates to the substrate articles comprising such substrates and the epitaxial single crystal layers deposited thereon, as well as to semiconductor devices manufactured from such substrate articles. The invention further relates to a surface texturing method for making such substrates, and to methods of making the related epitaxial single crystal substrate articles, and the related semiconductor devices.

2. Description of The Related Art

In the field of semiconductor devices, crystalline materials such as diamond, cubic boron nitride, cubic boron phosphide, beta-silicon carbide, gallium nitride, and the like have been viewed as potentially desirable materials for forming epitaxial substrate layers for semiconductor manufacture, due to their advantageous physical and electronic properties, amenability to doping, etc.

Diamond in particular has been regarded as a potentially highly useful material for such applications. Accordingly, the ensuing background discussion of the present invention will be directed to diamond, however it will be appreciated that similar considerations apply to other crystalline materials such as those illustratively referred to above in the preceding paragraph.

One of the primary problems facing diamond semiconductor device fabrication is the inability to form large area, high quality single crystal diamond films. Unfortunately, however, the state of the art in diamond film formation has not matured to a point where large area, defect-free single crystal thin films can be produced.

At the present time, large area diamond films formed by known growth techniques are polycrystalline in character. This fact has greatly restricted the application of diamond in the fabrication of high performance semiconductor devices.

The reason for the inability of conventional technology to form large area single crystal diamond films is not fully understood, but is partially attributable to the fact that the diamond surface has a high specific surface energy. As an example, the diamond (111) surface energy is approximately 3760 ergs per square centimeter, whereas for a corresponding (111) surface of silicon, the surface energy is on the order of only about 1250 ergs per square centimeter. As a result, the high surface energy values associated with diamond favor the formation of three-dimentional nuclei during the initial stages of diamond film formation by vapor phase techniques, e.g., the hot tungsten-filament method disclosed by S. Matsumoto, et al, Japanese Journal of Applied Physics, Vol. 21, L183 (1982), as well as other chemical vapor deposition techniques. These three-dimensional nuclei in turn cause the formation of polycrystalline diamond films when diamond is grown on substrate materials having a much lower surface energy than diamond itself.

In the early stages of growth of diamond films by vapor deposition techniques, before a continuous polycrystalline film is formed, isolated islands of diamonds initially appear on the substrate surface. Such islands are of single crystal character, with sizes varying widely but typically on the order of 2-10 micrometers on a side.

At this initial stage of diamond film formation, it is possible to grow high quality single crystals of diamond, however these tiny diamond islands are randomly scattered on the substrate, rendering it impossible to effectively utilize them for semiconductor device fabrication purposes. In addition, such diamond islands are not oriented with respect to the substrate surface, i.e., they exhibit no preferred orientation.

Subsequently, as film growth proceeds beyond the initial stage which is characterized by scattered islands of single crystal diamond, additional nucleation occurs on the faces of the small crystallite regions, and polycrystalline films are formed.

Another problem faced by attempts to grow high quality single crystals of diamond for semiconductor manufacturing application is the paucity of suitable substrate materials having the proper surface geometry and suitably close lattice matching of the substrate with the diamond lattice (i.e., having a lattice constant within about 10% of the diamond lattice constant). Nickel and copper are among the closest lattice matched materials to diamond, however despite their close lattice matching characteristics, these substrate materials either have surface energies which are lower than the diamond surface energy and/or they exhibit a large solubility for carbon and thus are unsuitable for diamond film formation methods utilizing vapor-phase carbonaceous precursors such as methane. As a result, single crystalline diamond films have not been grown on these substrate materials.

Insulating single crystals of bulk diamond are known, and can be readily manufactured by conventional techniques, as well as being of naturally occurring origin. Such diamond obviously represents a favorable substrate composition for growth of high quality epitaxial single crystals of semiconducting diamond, since the surface energies of the substrate material and the desired single crystal semiconducting diamond are identical or nearly identical, and the lattice constants of the insulating diamond and the semiconducting diamond are substantially equal.

Despite the favorable surface energies and lattice constants of epitaxial diamond and bulk single crystal insulating diamond, secondary nucleation and microtwinning phenomena occur in the epitaxial diamond film which tend to destroy the single crystal character of the epitaxial diamond film when grown on large area (for example, 1 mm × 1 mm) single crystal bulk diamond substrates. This secondary nucleation and microtwin crystal formation during diamond film growth is discussed by Spitsyn, et al, Journal of Crystal Growth, Vol. 52, page 219 (1981).

As a result of the foregoing problems and deficencies, it has not been possible to fabricate semiconductor devices which comprise large area epitaxially grown, single crystal semiconducting diamond films, or large area epitaxially grown, single crystal semiconducting films of the other crystalline materials illustratively referred to hereinabove. This fact has greatly restricted the application of these otherwise highly desirable crystalline materials in the manufacture of high performance electronic devices.

These drawbacks are overcome in accordance with the present invention, by the provision of textured substrates, epitaxial single crystal substrate articles, semiconducting devices, and associated manufacturing methods, as described hereinafter in detail.

SUMMARY OF THE INVENTION

The present invention obviates the need to grow large area single crystal epitaxial diamond films for diamond semiconductor device fabrication, by a method of surface texturing of the substrate which restricts the growth of single crystal epitaxial diamond layers to spatially confined surface regions of the substrate on which high quality single crystal diamond layers can be efficiently formed. Further, this method of surface texturing provides single crystal epitaxial diamond growth surfaces which are distributed in a regular periodic array on the substrate, so that the resulting substrate article comprising epitaxial single crystal diamond then can be used to manufacture semiconductor devices by the planar fabrication methods which are conventionally employed in the semiconductor industry.

The present invention is based on a discovery which is wholly at odds with the prior art motivation and attempts to grow large area single crystal diamond films for diamond semiconductor devices. Specifically it has been discovered that in order to construct active semiconductor devices out of diamond, it is only necessary to provide a single crystal region which is very small in size, as for example on the order of a few micrometers square and a micrometer thick.

Thus, the present invention takes advantage of the ability of diamond to be epitaxially grown in small sized single crystals e.g., crystals measuring about 0.5 to about 20 micrometers on a side. Such single crystal formation characteristic is advantageously utilized by the present invention in providing a textured substrate comprising a plurality of small-sized epitaxial diamond film growth regions which are distributed in a regular array on the substrate surface. The resultant substrate article comprising epitaxial single crystal diamond on the substrate, can then be employed to fabricate a wide variety of semiconductor devices, such as transistors and the like, by conventional planar processing techniques involving the deposition of appropriate conducting, semiconducting, and/or insulating materials on the semiconducting diamond substrate.

Although illustratively described above in respect of surfaces, substrate articles, and semiconductor devices associated with epitaxial single crystal diamond, it is intended that the foregoing discussion be broadly construed to include corresponding structure and devices relating to any other advantageously employed or employable epitaxial single crystal material.

DETAILED DESCRIPTION OF THE DRAWINGS

DETAILED DESCRIPTION OF THE INVENTION, AND PREFERRED EMBODIMENTS THEREOF

The invention will be illustratively described hereinafter with reference to the epitaxial formation of single crystal semiconducting diamond films on an insulating single crystal bulk diamond substrate.

As stated previously herein, insulating single crystal bulk diamond is a most favorable substrate material for growth of a high quality epitaxial single crystal diamond film, since the surface energies of the bulk diamond substrate and the epitaxial diamond film are either identical or substantially identical, and the lattice constants of the bulk diamond substrate and the epitaxial diamond film are likewise correspondingly matched.

The single crystal bulk diamond substrate in this illustrative embodiment may suitably be a Type IIa insulating material, manufactured by any conventional high temperature and high pressure forming techniques which are commercially employed to produce single crystal bulk diamond having an insulating character. Alternatively, the diamond substrate could be a naturally occurring single crystal diamond.

Although, as previously discussed, epitaxial growth of diamond films on bulk single crystal diamonds has been achieved, secondary nucleation and microtwinning invariably destroy the single crystal character of the diamond film as epitaxial growth proceeds.

In accordance with the present invention, the secondary nucleation and microtwinning formation problems are overcome by restricting the size of the epitaxial film growing regions to dimensions which are consistent with avoidance of secondary nucleation and microtwins.

Thus, by providing substrate surface areas of restricted size for epitaxial diamond growth, the time required to form the epitaxial film is reduced, to an extent which favors single crystal film growth without the formation of microtwins and/or secondary nuclei.

The method of the present invention effectively localizes the regions of epitaxial growth to yield single crystal epitaxial films, by providing a textured substrate surface having periodic surface regions of suitably small size, on which epitaxial growth of single crystal films can be carried out.

Figure 1:
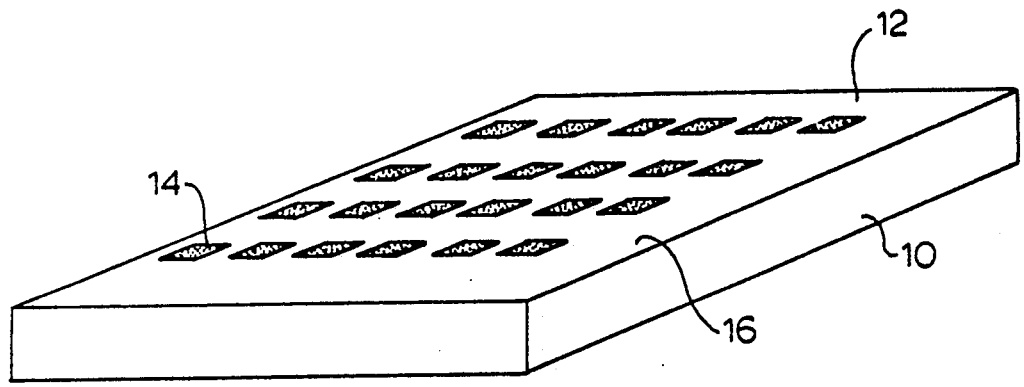
FIG. 1 is a perspective view of a Type IIa bulk single crystal insulating diamond substrate element, which has been selectively metal masked to define masked surface regions of the substrate for subsequent epitaxial single crystal film growth.

With reference to FIG. 1 and in accordance with a preferred embodiment of the invention, a substrate 10 of bulk single crystal (Type IIa) insulating diamond is provided, which may be of any suitable overall shape, such as block form shown. This single crystal has a generally planar face 12, which in the orientation of the crystal shown in the drawing is the top main surface of the substrate element, in the (111) plane of the crystal.

Thus, the substrate may be a single crystal bulk diamond insulating substrate in the form of a planar block as shown, having 110, 111, 100 orientation, and made by conventional high temperature, high pressure techniques.

Prior to processing, it may be desirable to clean the substrate to prepare it for the subsequent masking, etching, and metallization steps. For example, the substrate initially may be organic solvent washed in an ultrasonic cleaning chamber, followed by acid washing, and final rinsing in deionized water.

In the substrate element shown in FIG. 1, the generally planar face 12 of the single crystal substrate 10 has been metal masked to define masked square-shaped surface regions in a regular periodic array. The masked surface areas of the substrate may alternatively be of other shapes, e.g., of circular, elliptical, triangular, or other (non-square) quadrilateral shape, however it generally is preferred as a practical matter to utilize the square shape illustrated, to maximize the density of the surface regions for single crystal epitaxial film growth, to in turn maximize the density of the semiconductor devices which may be manufactured on the substrate element.

The metal masked surface regions may have any suitable dimensional characteristics which accommodate single crystal film growth, however it generally is preferred when utilizing the square geometry of masked surface regions illustrated in FIG. 1, to provide a patterned array of such surface regions with a spacing of from about 2 to about 5 micrometers between adjacent facing sides of the adjacent square surface regions, with such square surface regions having sides of a length which is on the order of from about 0.5 to about 20 micrometers, preferably from about 1 to about 10 micrometers, and most preferably from about 2 to about 5 micrometers.

If the aforementioned spacing distance between adjacent facing sides of adjacent metal masked surface regions decreases significantly below about 2 microns, there is the increasing tendency for crystal bridging between corresponding adjacent posts in the subsequent formation of epitaxial single crystal layers on the substrate, such posts being formed with the metal masked surface regions as the top surfaces thereof, as described in greater detail hereinafter.

If, on the other hand, the spacing between adjacent metal masked surface regions becomes substantially greater than about 5 microns, then the economic benefit associated with the provision of a close-packed array of surface regions for forming semiconductor devices is increasingly lost. It will be appreciated that spacing distances between adjacent masked surface regions nonetheless may be usefully employed, despite the fact that the arrangement of surface regions is not economically optimum.

By way of example the metal mask applied to the main top surface 12 of the substrate 10 may define square-shaped surface regions each having a side dimension of 5 micrometers, with the spacing between adjacent facing sides of adjacent square regions also being 5 micrometers.

In the masking process, the metal mask preferably is applied to the single crystal substrate element with the substrate oriented so that the main top surface 12 is in the (111) plane of the substrate.

In order to form the metal masked surface regions 14 on the main top surface of the single crystal substrate, a suitable photoresist composition is first applied to the main top surface 12 of the substrate element, followed by exposure of the photoresist through a mask, so that the photoresist on the primary surface 16 of the main top surface 12 is developed (the term "primary surface" here referring to the portion of the main top surface 12 which does not include the surface area defined by the array of square-shaped surface regions 14). The main top surface of the substrate element then is metallized, followed by removal of the developed photoresist and metal film from the primary surface, to leave the regular pattern of metal film squares shown in FIG. 1.

The metal film which is applied to the substrate main top surface to subsequently form the metal squares, may be on the order of about 0.1 micrometer in thickness, and may be deposited by any suitable method, as for example electron beam evaporation of the metal from a bulk source of same. The metal may comprise any suitable metal species, e.g., copper, aluminum, nickel, iron, silicon, etc., with copper generally being preferred due to its resistance to carbide formation and its ease of removability from the substrate at temperatures in the range of those which are usefully employed for its deposition.

After the metallization of the main top surface of the substrate element, the removal of the metal film from the primary surface 16 of the main top surface 12, along with the exposed resist coating over which the metal film has been deposited, may be carried out by any suitable metal removal methods commonly employed in the semiconductor art to remove metal films from developed resist-coated regions of substrate materials.

Figure 2:
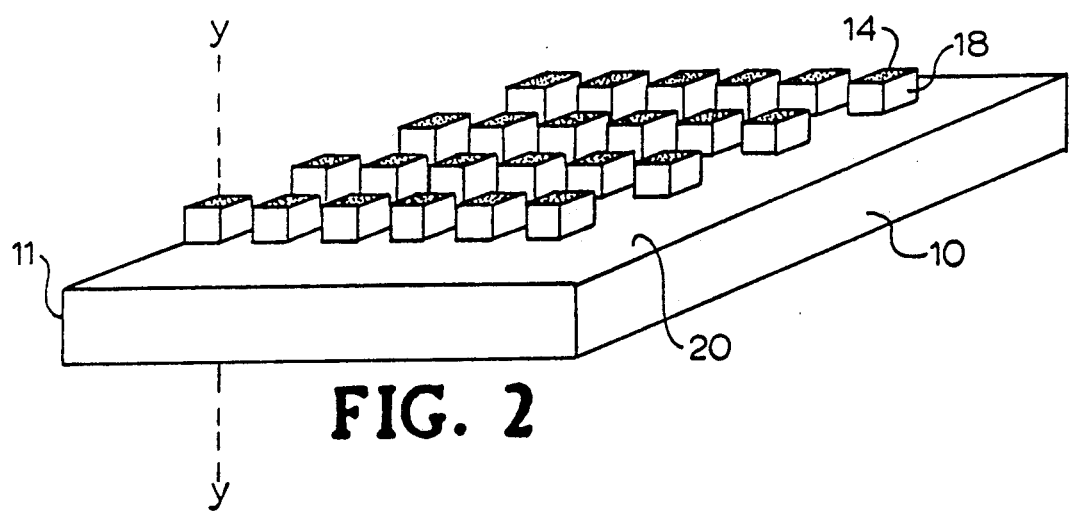
FIG. 2 is a perspective view of the FIG. 1 substrate after reactive ion etching thereof to form a regular periodic array of integral posts on the main top surface of the substrate.

Next, the substrate as shown in FIG. 1 is submitted to a surface removal process in which the primary surface of the substrate is selectively removed to a predetermined depth, to yield a substrate of the structure shown in FIG. 2. The FIG. 2 substrate 10 thus comprises a generally planar base portion 11, and a regular array of posts or column structures 18 extending upwardly from the (new) main top surface 20 thereof. The posts 18 correspond in cross-sectional shape to the metallized surface regions 14 on the main top surface 12 of the original substrate element (see FIG. 1). These surface regions remain coated with the metal film, and form top surfaces of the posts 18 in the modified substrate element shown in FIG. 2. Thus, each post top surface defines a cross-section which is substantially constant along the axial dimension y-y of the post, as shown in FIG. 2.

The selective removal of the substrate to form the regular array of post structures 18 is suitably carried out by reactive ion etching of the substrate. For example, the patterned substrate as shown in FIG. 1 may be placed in the path of an ion gun, with ions being generated and directed at the substrate for reactive ion etching thereof. In this manner, a selected depth of the insulating diamond substrate is removed from those areas constituting the primary surface of the substrate, which are not covered with the metal mask.

In the case of a bulk single crystal insulating diamond substrate, reactive ion etching can be effected by bombarding the diamond substrate with xenon ions ($Xe+$) at energies on the order of about 1 to about 4 electron kilovolts (Kev), in a background atmosphere of nitrogen dioxide (NO$_2$) at a suitably low pressure, e.g., $2 \times 10^{-4}$ torr, and at a flux density of approximately 1 milliamp per square centimeter, with the substrate preferably being disposed at a selected angle with respect to the ion beam. Such reactive ion etching of diamond is described in Efremow, et al, *J. Vac. Sci. Technol.* B3, 416 (1985).

In this fashion, the xenon ions bombard the surface of the substrate on which nitrogen dioxide has been adsorbed. The adsorbed NO$_2$ is decomposed and the oxygen constitutent thereof reacts with the diamond to yield carbon monoxide, so that the diamond surface is preferentially etched in those areas which are not covered by the metal mask 14. Under the previously described reactive ion etching conditions, the etching will proceed at a rate on the order of about 2,000 Angstroms per minute, at ambient (room temperature) conditions, with the etching process being continued until a selected extent of the substrate has been removed.

After the substrate surface removal process has been completed, there is left a substrate element comprising a regular array of posts extending upwardly from a newly formed main top surface 20 of the base 11 of the substrate, with the posts having top surfaces which remain coated with the metal layer previously applied. Five minutes etching at the aforementioned 2,000 Angstrom/minute etching rate will produce post structures which are approximately 1 micrometer in height.

Following the formation of the regular array of posts, the metal film is removed from the top surfaces of the posts by acid washing, followed by rinsing of the substrate in deionized water, so that the native diamond (111) surface is re-exposed on the tops of the respective posts.

Next, an inverse photoresist is applied to the substrate element, followed by application of the same mask as employed in the initial masking to define square-shaped surface regions on the top main surface of the original substrate. The resist material is exposed through the mask, so that after development the developed resist is on top of the posts i.e., the areas previously occupied by the metal film (see FIG. 2). The unexposed inverse photoresist then is removed from the primary surface of the ion etched substrate and from the side surfaces of the posts.

The etched substrate, resist-coated now only on the top surfaces of the posts, next is metallized utilizing a suitable metal, which may for example be of the same type employed in the initial metallization step, such as copper, nickel, aluminum, iron, etc., with copper generally being preferred. The metal film likewise may be applied to the substrate by electron beam evaporation of metal, to form a film of desired suitable thickness characteristics.

Figure 3:
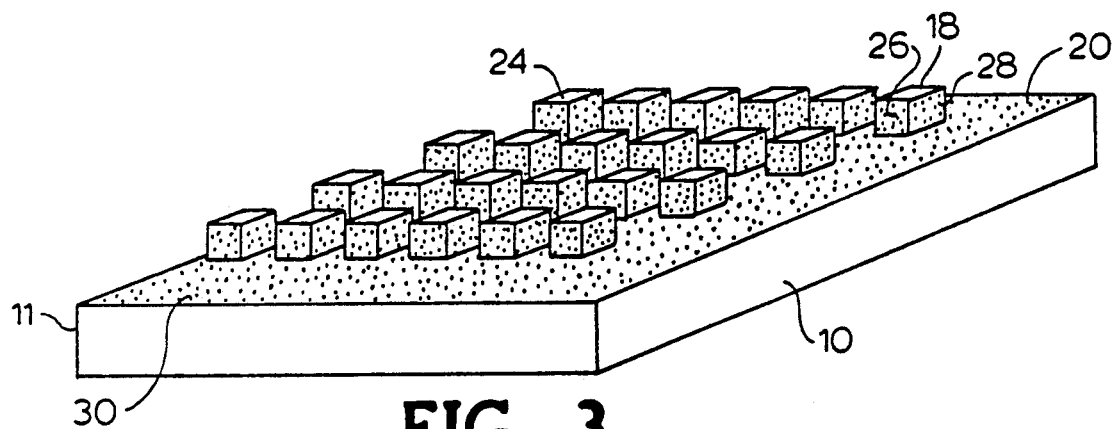
FIG. 3 is a perspective view of the FIG. 2 substrate after the top surfaces of the posts have been demetallized, and the primary surface and post side surfaces of the substrate have been metallized.

The metal and inverse photoresist then are removed from the top surfaces of the posts, by any suitable conventional removal techniques, which are well known to those skilled in the art. The native (111) diamond surface at the upper extremity of the respective posts thereby is again exposed, to yield the textured substrate shown in FIG. 3, wherein the posts 18 have native (111) diamond top surfaces 24 and metallized side surfaces 26 and 28, with the primary surface 20 likewise being coated with the metal film 30.

The textured substrate 10 now is ready for growth of epitaxial diamond on the top surfaces of the posts 18.

Prior to formation of the epitaxial diamond on the upper surfaces of the posts, the textured substrate preferably is subjected to ion beam sputtering to effect cleaning of the post top surfaces 24, as for example with ion beam generation of argon ions at energy levels on the order of 1-2 electron kilovolts (Kev). Contemporaneously, the substrate article preferably is heated to anneal any surface anomalies on the post top surfaces. Such annealing may for example be carried out by heating the diamond substrate in a hydrogen atmosphere, at reduced pressures on the order of about $10^{-6}$ to about 100 torr, and at temperatures on the order of from about 450° C. to about 900° C.

Following such preferred cleaning and annealing steps, an epitaxial layer of single crystal diamond may be grown on the top post surfaces of the textured substrate article in any suitable known manner, such as hot filament assisted chemical vapor deposition (CVD) or by microwave or radio frequency (RF) plasma-assisted CVD.

Thus, with the textured substrate at elevated temperature, e.g., on the order of from about 800° C. to about 900° C., the substrate surface may be exposed to a dilute mixture of a suitable hydrocarbon, such as methane, in hydrogen, with the gas mixture being either passed over a hot filament or through a plasma (microwave or RF) to effect the CVD process.

By way of example, the CVD process for growing epitaxial diamond on the post top surfaces of the textured substrate may be carried out at pressures on the order of from about $10^{-4}$ to about 100 torr, utilizing a gas mixture of 0.1 percent by weight methane in hydrogen. To effect the deposition of a semiconducting epitaxial diamond film in the CVD process, the deposition is carried out with the addition of a small amount of a dopant precursor, such as diborane (B$_2$H$_6$), to the dilute hydrocarbon vapor.

In the case of the previously described dilute methane gas mixture (0.1% methane in hydrogen), a stream of 50 parts per million (ppm) of diborane in hydrogen may be added to the methane gas mixture, to effect boron doping of the epitaxial diamond layer formed on the top surfaces of the textured substrate posts. At epitaxial diamond layer growth rates on the order of about 1 micrometer per hour, the diborane may for example be introduced into the CVD gas mixture at a sufficient rate to yield a concentration of about $10^{16}$ boron atoms per cubic centimeter in the deposited epitaxial film. In this manner, a p-type diamond single crystal layer is formed on the top surfaces of the respective posts of the textured element.

During a final stage, e.g., the last few minutes, of the growth of the single crystal diamond epitaxial layer on the post top surfaces of the textured substrate, the concentration of diborane may be selectively increased, to form a heavily doped p$^+$ layer for making ohmic contacts to the semiconducting p-type diamond microcrystalline layer. For example, when diborane is introduced in a selected amount and at a selected rate to provide concentrations of boron atoms in the p-type diamond layer on the order of about $10^{16}$ atoms per cubic centimeter, the diborane concentration at the final stage of the growth process may be increased by approximately two orders of magnitude, to achieve a doping level of approximately $10^{18}$ boron atoms per cubic centimeter of epitaxial film. As a result, there is formed on top of the p-type semiconductor epitaxial single crystal diamond layer a heavily p$^+$ doped region of diamond, suitable for providing ohmic contacts on the p-type semiconducting diamond layer.

It will be appreciated that during the epitaxial growth of diamond on the post top surfaces, spurious diamond crystals may nucleate on the metallized areas of the substrate, viz., the post side surfaces 26 and 28 and the primary surface 20 thereof. Accordingly, the metal film on these surfaces, after the single crystal epitaxial layer formation has been completed, is removed by any suitable demetallization technique, to concurrently remove any spurious diamond crystals that may have nucleated on the metallized surfaces during the deposition of the single crystal epitaxial layer.

Figure 4:
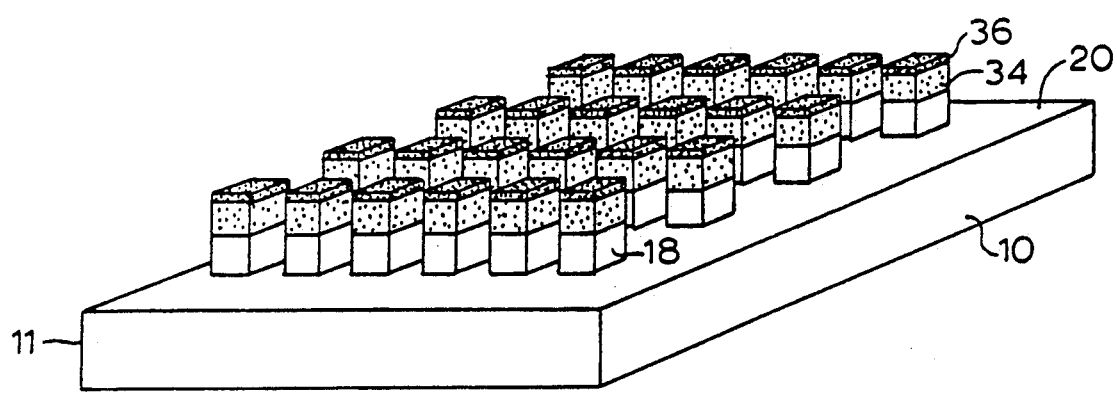
FIG. 4 is a perspective view of the substrate of FIG. 3 after successive p-type and p+ doped single crystal diamond layers have been epitaxially formed on the top surfaces of the posts, and the primary surfaces and post side surfaces of the substrate have been demetallized to provide a substrate article for fabrication of semiconductor devices.

The resulting demetallized substrate article is shown in FIG. 4, as comprising a substrate base 10 having a main top surface 20 from which upwardly extends a plurality of square cross-sectioned posts 18, on the upper surfaces of which is deposited a single crystal epitaxial diamond layer structure comprising a p-type semiconducting single crystal diamond layer 34 and p+ doped single crystal diamond layer 36 for ohmic contact formation.

Thus, there is provided an all diamond structure, comprising the textured insulating diamond substrate, with successive p-type semiconducting single crystal diamond and p+ doped single crystal diamond layers grown on top of the posts formed by reactive ion etching of the original single crystal substrate element.

As a result of the textured surface character of the substrate described hereinabove, the prior art barriers to epitaxial diamond film formation, i.e., lattice mismatch between the epitaxial film and the substrate material, and/or microtwinning and generation of secondary nucleation structures in the epitaxial film, are overcome, and a substrate article is provided with a single crystal epitaxial diamond layer which may be employed to form a wide variety of semiconductor devices.

The small surface areas of the post top surfaces on the textured substrate of the invention permit epitaxial growth of single crystal layers to be achieved, in relatively short periods of time which preclude secondary nuclei formation and resultant propagation of polycrystalline morphology.

Typically, the epitaxial diamond layer formation may be carried out on the textured substrate of the invention at diamond deposition rates on the order of from about 0.5 to about 1 micrometer per hour, so that epitaxial diamond films of requisite thickness can be achieved generally in less than about 10 hours time. In preferred practice, the epitaxial layer growth process is carried out for less than about 5 hours, to provide an additional margin of safety in avoiding secondary nucleation and formation of polycrystallinity in the deposited diamond film.

The above-described substrate article and substrate texturing method of the invention, while illustratively described in application to the formation of epitaxial single crystal diamond layers on bulk diamond substrates, can be extended to the use of other materials which present the semiconductor device fabrication engineer with insurmountable problems in achieving large area high quality single crystalline layers.

Illustrative examples of such other cystalline systems include the formation of: single crystal epitaxial layers of cubic boron nitride on textured insulating diamond substrates; epitaxial layers of cubic boron phosphide on textured silicon substrates; cubic silicon carbide epitaxial layers on textured substrates of materials such as silicon, boron phosphide, and titanium carbide; gallium nitride epitaxial layers on alpha-silicon carbide; etc. In these various material systems, the textured substrates of the present invention provides small areas for deposition of epitaxial high quality microcrystals, and the epitaxial growth surfaces are distributed over the substrate surface in a regular periodic array so that the resulting epitaxial films are amenable to conventional planar semiconductor fabrication techniques.

Thus, employing the substrate texturing process of the invention, as illustratively described above in respect of forming epitaxial semiconducting diamond layers on bulk insulating diamond substrates, small high quality single crystals of a desired semiconductor can be provided in useable form. In many instances, as discussed previously herein, it has been extremely difficult or impossible to grow large area single crystals of various materials which otherwise would be advantageous and useful in the fabrication of semiconductor devices. This has been particularly true for diamond, cubic boron nitride and cubic silicon carbide; for these materials, the small-sized epitaxial growth surfaces of the substrate articles of the present invention serve a critical function in avoiding the formation of defects in the epitaxial films deposited on the substrate. In addition, as mentioned, the use of small-sized epitaxial growth surfaces permits epitaxial layer growth times to be correspondingly reduced, to levels consistent with the avoidance of secondary nucleation of spurious crystallites on the epitaxial single crystal layer.

As an illustrative example of the utility of the substrate article shown in FIG. 4 for fabricating semiconductor devices, the construction of a field effect transistor (FET) on such substrate article now will be described, including the formation of ohmic contacts to define emitter and collector electrodes, and the deposition of a Shottky barrier to form a gate electrode for the FET.

The ensuing discussion is directed to the formation of an FET on a textured substrate post structure, which comprises (i) a insulating diamond post extending upwardly from the base of the substrate element, (ii) a p-type epitaxial single crystal diamond layer on the insulating diamond post, and (iii) a p+ doped epitaxial diamond layer on the p-type diamond epitaxial layer.

As a first step of forming the ohmic contacts for the FET device, a resist is applied to the substrate article shown in FIG. 4, following which a mask is applied to define masked source and drain electrode regions on the top surface of the p+ doped diamond epitaxial layer. After exposure of the resist through the mask, the unexposed resist is removed from the masked areas defining the source and drain electrode regions on the top surfaces of the post structure.

The ohmic contacts then are formed on the top surface of the post structure, by application of successive metal layers comprising a titanium (or tantalum) layer deposited by electron beam evaporation of the source metal, and a gold layer which is deposited by electron beam evaporation of gold on the titanium layer.

The developed resist then is removed by conventional removal techniques from the substrate article, concurrently removing the titanium and gold metal layers deposited thereon, and exposing the surface of the p+ doped epitaxial layer between the source and drain electrode regions. To complete the formation of the ohmic contacts, the substrate article comprising the ohmic contact metal layers is heated to an elevated temperature, which may for example be on the order of from about 775° C. to about 885° C. in a hydrogen atmosphere, for sufficient time, e.g., 30 minutes, to anneal the assembly and yield the finished ohmic contacts. Such type of annealing is illustratively described in Moazed, et al, IEEE Electron Device Letters, Vol. 9, p. 350 (1988).

Next, the p+ doped diamond surface between the respective source and drain electrode regions is patterned for subsequent formation of the Schottky barrier gate region. A suitable photoresist composition is applied to the substrate assembly comprising the ohmic contacts, followed by masking to define the gate electrode region. After exposure through the mask to develop the resist, the substrate assembly is metallized with a metal such as copper that can be easily removed without causing damage to the previously formed ohmic contact regions.

The unexposed resist material then is removed together with the metal film deposited on the unexposed areas of the p+ doped layer between the ohmic contact source and drain electrode regions. The substrate assembly comprising the metal masked ohmic contact regions next is reactively ion etched using a xenon (Xe+) beam in a background of nitrogen dioxide ($NO_2$), to remove only the heavily doped p+ epitaxial diamond layer from the gate region previously defined by the masking operation. This ion etching process is carried out in a manner similar to that previously described with respect to the formation of posts on the original insulating diamond substrate element. In this manner, the p+ doped diamond layer is removed from the region on which the Schottky barrier will be fabricated.

Next, the substrate assembly is masked to define the Schottky barrier region after a resist has been applied to the surface of the p-type diamond layer. The resist then is exposed through the mask, and the substrate assembly is metallized. The undeveloped resist and metal film then are removed from the Schottky barrier region, to leave a surface of p-type single crystal diamond between the source and drain electrode regions which is surrounded by a metal film on the exposed resist.

On this p-type single crystal diamond surface, the Schottky barrier is formed by first depositing a thin tungsten film via electron beam evaporation of bulk tungsten metal, followed by deposition of a gold overlayer on the tungsten film, by electron beam evaporation of bulk gold metal. The resulting Schottky barrier comprising the sequential tungsten and gold layers thus forms a contact region to the external circuit comprising the FET device. The mask metal and exposed resist between the gate electrode region and the respective source and drain electrode regions then is removed to yield the final FET device.

Figure 5:
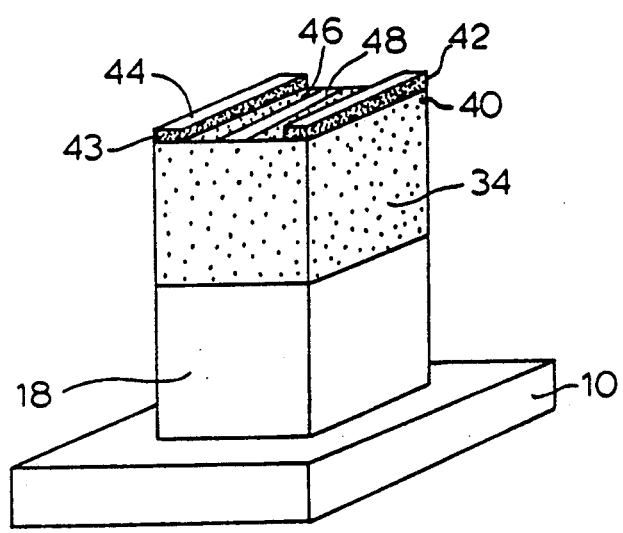
FIG. 5 is a perspective view of a field effect transistor, manufactured on the top surface of a single crystal epitaxial diamond layer deposited on a single post of the textured surface substrate article shown in FIG. 4.

As shown in FIG. 5, the FET device comprises the insulating diamond base structure 10 having a post 18 of insulating diamond extending upwardly therefrom, on the top surface of which is deposited the p-type semiconductor diamond layer 34, on which in turn is deposited, along respective opposite sides 40 and 42 thereof, p+ doped single crystal diamond layers 43 and 44, respectively. Deposited on the respective p+ semiconducting diamond layers 42 and 44 are sequential titanium and gold layers which corporately constitute the ohmic contact regions forming the respective source and drain electrode regions of the FET device.

On the top surface 46 of the p-type diamond epitaxial layer 34, between the respective p+ semiconductor diamond layers 42 and 44, is the tungsten Schottky barrier 48 constituting the gate electrode region of the FET device.

Thus, while invention has been illustratively described hereinabove with reference to the fabrication of a textured diamond substrate for fabrication of an FET device, it will be apparent that the invention may be practiced with any suitable substrates and with crystalline materials which are crystallographically compatible with the substrate but which are otherwise difficult or impossible to form in large area single crystal epitaxial layers.

It will also be appreciated that numerous other semiconductor devices, other than the FET device illustratively described, may be usefully produced of the textured substrate articles of the invention, by techniques which are well known in the semiconductor device fabrication art for forming conducting, semiconducting, and/or insulating layers on substrate materials to create electronic devices. The methodology of the present invention provides a textured substrate article for such purpose, which is highly amenable to the planar processing techniques employed to form microcircuitry devices in the semiconductor field, and such methodology also may have broad utility in other fields where single-crystal epitaxial layers are advantageously employed.

The features and advantages of the present invention are more fully illustrated with respect to the following nonlimiting example, wherein all parts and percentages are by weight, unless otherwise expressly stated.

EXAMPLE

An FET device is fabricated from a single crystal Type IIa insulating diamond substrate, made by conventional high temperature and pressure techniques and having (110, 111, 100) orientation, with the crystal positioned so that the (111) surface is oriented to be the main top surface of the substrate article.

The single crystal insulating diamond substrate is organic solvent cleaned with hot trichloroethylene in an ultrasonic cleaning chamber. After ultrasonic solvent cleaning, the substrate is acid washed by immersion in a saturated solution of $CrO_3$ in $H_2SO_4$ at 200° C. followed by washing in a solution of 30% $H_2O_2$ and $NH_4OH$ (1:1), and rinsed in deionized water.

The main top surface of the substrate crystal of insulating diamond then has applied thereto a resist such as Waycoat HNR 80 or HPR 204 (commercial(y available from Olin Hunt Corporation), and is masked to define a regular pattern of masked squares 5 micrometers on a side. The resist-coated main top surface of the substrate element is exposed through the mask to develop the exposed areas surrounding the unexposed resist-coated square surface regions. The spacing of the masked squares in the regular array, measured as the distance perpendicular to the adjacent facing sides of successive squares in the array, is 5 micrometers.

The substrate element's main top surface then is metallized with a 0.1 micrometer thick film of copper, followed by removal of the exposed resist and overlying metal film which surrounds the square surface regions.

The metallized substrate then is subjected to reactive ion beam etching with xenon ions, at an energy level of 2–4 electron kilovolts (Kev), and a flux density of approximately 1 milliamp per square centimeter, with the substrate angled with respect to the ion beam, as disclosed in the aforementioned Efremow, et al article. The etching is carried out at a rate of approximately 2,000 Angstroms per minute, at room temperature, to produce a well defined textured surface characterized by posts of square cross-section extending upwardly to a height of about 1 micrometer from the etched top surface of the substrate.

The copper film layer then is removed from the respective H post top surfaces by acid etching in dilute HF:HNO$_3$ aqueous solution and rinsing of the textured substrate in deionized water.

Next, an inverse photoresist is applied to the textured substrate, and exposed through the same mask used to initially form the square regions which now form the top surfaces of the posts on the textured substrate. Following development of the inverse photoresist through the mask, and removal of the unexposed resist material, the top surfaces of the respective posts are coated with the exposed resist.

A film of copper then is deposited by electron beam evaporation on the entire textured substrate, followed by removal of the metal film and resist from the top surfaces of the posts.

The top surfaces of the respective posts then are cleaned by ion beam sputtering with argon ions, at an energy of 1–2 Kev.

Next, p-type single crystal diamond is epitaxially formed on the top surfaces of the posts of the textured substrate, by hot filament assisted chemical vapor deposition, at a pressure of 10 torr, from a gas mixture of 0.1% methane in hydrogen, with the addition of a stream of 50 ppm diborane in hydrogen, N at a sufficient rate to yield approximately $10^{16}$ boron atoms per cubic centimeter in the deposited epitaxial layer. The deposition of p-type diamond in this manner is continued for one hour, to provide a 1.0 micrometer thickness of epitaxial p-type diamond. The diborane concentration is increased in the last few minutes of the epitaxial diamond deposition, to form a heavily doped p+ region for making ohmic contacts. The doping level of the p+ region is approximately $10^{18}$ boron atoms per cubic centimeter of epitaxial film.

As a result, a cube of semiconductor diamond is formed by epitaxial deposition on the post top surface of the textured substrate, measuring 5×5×1 micrometers. The p+ doped epitaxial diamond layer is approximately 2,000–3,000 Angstroms thick.

Finally, the metallization is removed from the textured substrate article, to remove spuriously nucleated diamond on the post side surfaces and the main top surface (primary surface) of the textured substrate.

The resulting textured substrate article comprising sequential single crystal layers of p-type semiconductor diamond and p+ doped diamond then is employed as the active surface for fabrication of an FET device, as described in connection with FIG. 5 hereof, comprising titanium/gold ohmic contacts forming source and drain electrode regions, and a tungsten Schottky barrier disposed therebetween as a gate electrode.

While the invention has been described with reference to specific embodiments and preferred features thereof, it will be apparent that numerous other embodiments, variations, and modifications exist, and accordingly, all such embodiments, variations, and modifications are to be regarded as being within the spirit and scope of the invention.

What is claimed is:

1. A textured substrate article, comprising:
   a single crystal base of a selected crystalline material, including a generally planar primary surface and a regular periodic array of posts integrally extending from the primary surface and terminating in top surfaces; and
   a single crystal epitaxial layer of a selected crystalline material deposited on the top surfaces of the posts, the single crystal epitaxial layer being selectively doped with a deposit component imparting semiconductor properties to the epitaxial layer;
   the crystalline lattice constants for the base single crystal material and the epitaxial layer single crystal material being within 10% of one another;
   the single crystal material of the epitaxial layer being selected from the group consisting of diamond, cubic boron nitride, boron phosphide, beta-silicon carbide, and gallium nitride;
   the posts having a height of from about 0.5 to about 10 micrometers, and a cross-section dimensional characteristic of from about 0.5 to 20 micrometers; and
   the spacing between adjacent posts being from about 2 to about 5 micrometers, as measured between adjacent facing surfaces of the posts.

2. A textured substrate article according to claim 1, wherein the epitaxial layer is selectively doped to provide a main layer portion of p-type semiconductor single crystal material and an upper layer portion of p+ doped material.

3. A textured substrate article according to claim 1, wherein the base single crystal material is the same material as the epitaxial layer single crystal material.

4. A textured substrate according to claim 1, wherein the base single crystal material is selected from the group consisting of diamond, silicon, boron phosphide, cubic boron nitride, titanium carbide, and silicon carbide.

5. A textured substrate article according to claim 1, wherein the posts have a quadrilateral cross-section.

6. A textured substrate article according to claim 1, wherein the posts have a square cross-section.

7. A textured substrate article according to claim 1, wherein the base single crystal material is Type IIa diamond, and the single crystal epitaxial layer comprises a main layer portion of p-type semiconductor diamond, and an upper layer portion of p$^{30}$ doped diamond.

8. A semiconductor device, comprising a textured substrate article according to claim 1.

9. A semiconductor device comprising a textured substrate article according to claim 1, on the single crystal epitaxial layer of which ohmic contacts have been formed.

10. A field effect transistor device, comprising:
    a single crystal insulating diamond substrate including a substrate base and a post of square cross-section extending upwardly therefrom and terminating in a post top surface;
    a single crystal epitaxial layer of p-type semiconductor diamond on the post top surface;
    single crystal epitaxial layers of p+ doped diamond in spaced relationship to one another on the single crystal epitaxial layer of p-type semiconductor diamond;
    ohmic contacts on each of said single crystal epitaxial layers of p+ doped diamond, forming respective source and drain electrodes; and
    a Schottky barrier gate electrode on the single crystal epitaxial layer of p-type semiconductor diamond, between said source and drain electrodes.

11. A field effect transistor device according to claim 10, wherein the ohmic contacts comprise sequentially deposited titanium and gold layers.

12. A field effect transistor device according to claim 11, wherein the Schottky barrier gate electrode comprises sequentially deposited tungsten and gold layers.

13. A field effect transistor device according to claim 10, wherein the single crystal epitaxial layer of p-type semiconductor diamond is boron doped.

14. A diamond semiconductor substrate article, comprising:
an insulating diamond substrate including a substrate base and a regular array of post structures extending outwardly from a main top surface thereof, each such post structure comprising (i) a post integral with the substrate base and terminating in an outer surface, (ii) an epitaxial single crystal p-type diamond layer deposited on the post outer surface, and (iii) an epitaxial single crystal p+ doped diamond layer deposited on the p-type diamond layer;
the posts having a height of from about 0.5 to about 10 micrometers, and a cross-section dimensional characteristic of from about 0.5 to about 20 micrometers; and
the spacing between adjacent posts being from about 2 to about 5 micrometers, as measured between adjacent facing surfaces of the posts.

15. A diamond semiconductor substrate article according to claim 10, wherein the epitaxial single crystal diamond layers of respective post structures are correspondingly oriented with respect to one another and with respect to the main top surface of the substrate base.

16. An insulating diamond textured substrate for deposition of epitaxial single crystal layers thereon, comprising an insulating diamond substrate base having a substantially planar main top surface from which upwardly extends a regular periodic array of rectangular cross-sectioned posts, each of said posts terminating in a top post surface which is substantially co-planar with top post surfaces of other posts in the array, and with the top post surfaces being substantially parallel to the main top surface of the substrate base;
the posts having a height of from about 0.5 to about 10 micrometers, and rectangular cross-sections, which are from about 0.5 to about 20 micrometers on a side; and
the spacing between adjacent posts being from about 2 to about 5 micrometers, as measured between adjacent facing side surfaces of the posts.

17. An insulating diamond textured substrate according to claim 16, wherein the posts are from about 1 to about 10 micrometers in height, with each post having a square cross-section which is from about 1 to about 10 micrometers on a side.

* * * * *